United States Patent
Kao

(10) Patent No.: US 8,228,107 B2
(45) Date of Patent: Jul. 24, 2012

(54) CLOCK SIGNAL BALANCING CIRCUIT AND METHOD FOR BALANCING CLOCK SIGNAL IN IC LAYOUT

(75) Inventor: De-Yu Kao, Taipei (TW)

(73) Assignee: Princeton Technology Corporation, Xindian Dist., New Taipei (TW)

( * ) Notice: Subject to any disclaimer, the term of this patent is extended or adjusted under 35 U.S.C. 154(b) by 49 days.

(21) Appl. No.: 12/897,795

(22) Filed: Oct. 5, 2010

(65) Prior Publication Data
US 2011/0089984 A1   Apr. 21, 2011

(30) Foreign Application Priority Data
Oct. 20, 2009   (TW) .............................. 98135400 A

(51) Int. Cl.
*H03K 3/00*   (2006.01)
(52) U.S. Cl. ........................................ 327/298; 327/294
(58) Field of Classification Search .................. None
See application file for complete search history.

(56) References Cited

U.S. PATENT DOCUMENTS

| | | | | |
|---|---|---|---|---|
| 5,220,216 A * | 6/1993 | Woo | ................................. | 326/50 |
| 5,317,202 A * | 5/1994 | Waizman | ....................... | 327/156 |
| 5,712,884 A * | 1/1998 | Jeong | ............................ | 375/375 |
| 5,821,783 A * | 10/1998 | Torimaru et al. | ............. | 327/108 |
| 6,304,119 B1 * | 10/2001 | Tseng et al. | .................. | 327/161 |
| 6,794,912 B2 * | 9/2004 | Hirata et al. | .................. | 327/158 |
| 7,649,389 B2 * | 1/2010 | Bae | ............................... | 327/158 |

* cited by examiner

*Primary Examiner* — An Luu
(74) *Attorney, Agent, or Firm* — Winston Hsu; Scott Margo

(57) ABSTRACT

A method for balancing clock signals in an IC layout includes obtaining a data-flow information of the IC, selecting a first data-flow according to the dataflow information, and synchronizing a first clock signal from a first register and a second clock signal from a second register involved in the first data-flow. The data processed by the first register is directly transmitted to the second register or transmitted through a combinational logic circuit to the second register. The first data-flow is not related to other data-flows included in the data-flow information.

16 Claims, 7 Drawing Sheets

CLOCK SIGNAL BALANCING CIRCUIT AND METHOD FOR BALANCING CLOCK SIGNAL IN IC LAYOUT

BACKGROUND OF THE INVENTION

1. Field of the Invention

The present invention is related to a circuit and a method for synchronizing the clock signals in the IC layout, and more particularly, to a circuit and a method for controlling all the memory elements involved in the same data-flow to receive the synchronized clock signals in the IC layout so as to avoid the setup time error and the hold time error.

2. Description of the Prior Art

The clock signals in a digital circuit are often assumed to be synchronized when the IC designer designs the digital circuit. However, when the designed digital circuit diagram is carried out through the IC layout process, the staff of computer assisted design (CAD) has to consider the duration that the clock signal passes by the path from the clock signal source through the clock tree to each element and the resistance of the path, for balancing the received clock signal of each element (that is, synchronizing the received clock signal of each element). In this way, when the staff of CAD designs the routing of the clock signals, the resistance and the duration corresponding to each path of the branches of the clock tree has to be designed to be similar enough for avoiding that the elements receives the unsynchronized clock signals to result in the data error because of the setup time error and the hold time error.

In the prior art, many methods can balance the branches of the clock tree, for example, the Steiner tree. According to the above-mentioned methods, all the branches of the clock tree are considered to balance for synchronizing the branches of the clock tree. However, the conventional methods has more cost of the routing and increasing the number of buffers.

SUMMARY OF THE INVENTION

The present invention provides a clock signal balancing circuit for synchronizing a first clock signal with a second clock signal. The clock signal balancing circuit comprises a buffer gain controlling circuit, and a variable gain buffering circuit. The buffer gain controlling circuit is utilized for comparing the first clock signal with the second clock signal and accordingly generating a buffer gain. The variable gain buffering circuit is coupled to the buffer gain controlling circuit. The variable gain buffering circuit receives a third clock signal, adjusts a timing of the third clock signal accord to an amplitude of the buffer gain, and outputs the adjusted third clock signal.

The present invention further provides a method for balancing clock signals in an IC layout. The method comprises obtaining a data-flow information of an IC, selecting a first data-flow according to the dataflow information, and synchronizing a first clock signal from a first register and a second clock signal from a second register involved in the first data-flow. Data processed by the first register is directly transmitted to the second register or transmitted through a combinational logic circuit to the second register. The first data-flow is not related to other data-flows in the data-flow information.

DETAILED DESCRIPTION

Figure 1:
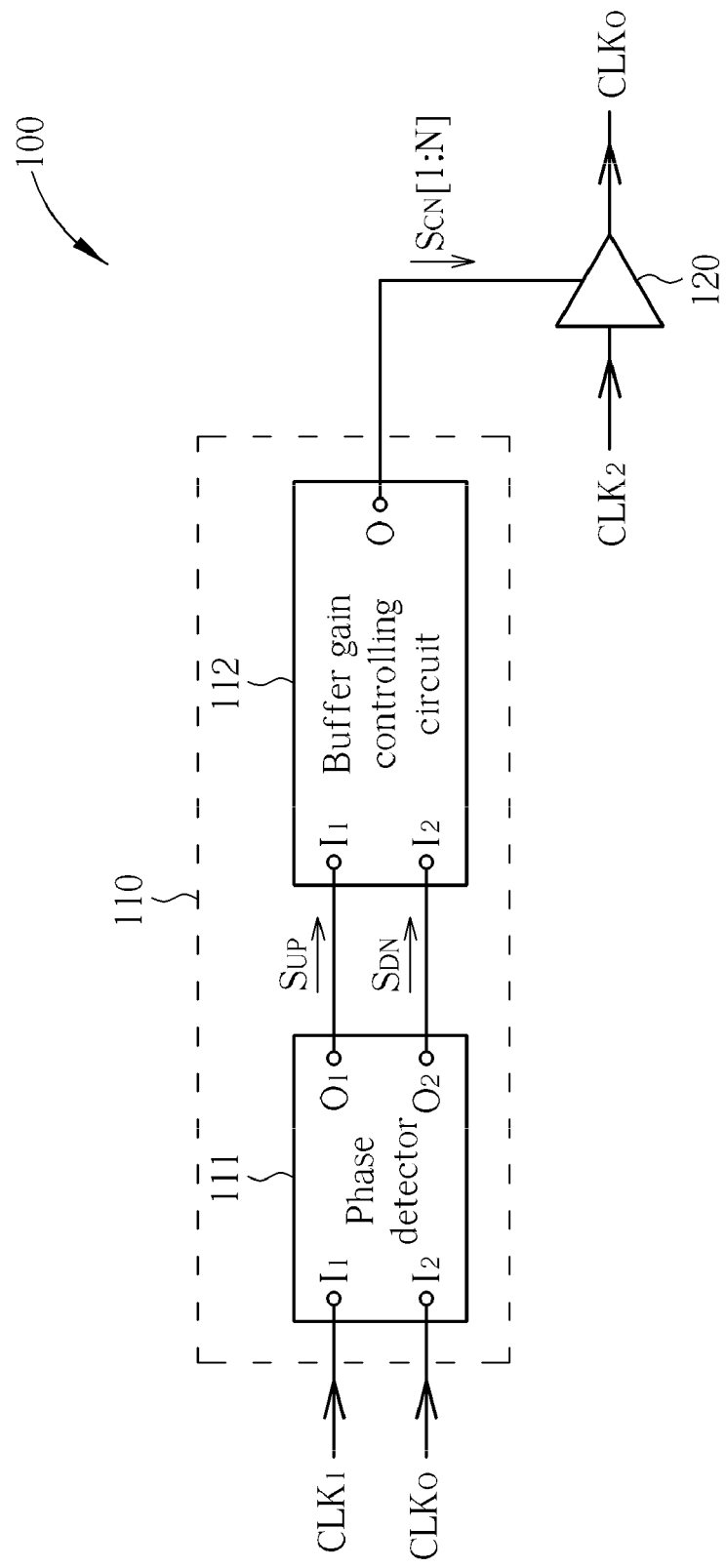
FIG. 1 is a diagram illustrating a clock signal balancing circuit of the present invention.

Please refer to FIG. 1. FIG. 1 is a diagram illustrating a clock signal balancing circuit 100 of the present invention. As shown in FIG. 1, the clock signal balancing circuit 100 comprises a buffer gain controlling circuit 110, and a variable gain buffering circuit 120. The buffer gain controlling circuit 110 is utilized for comparing the phases of the clock signals $CLK_1$ and $CLK_O$, and accordingly outputting the buffer gain $S_{CN}$, wherein the buffer gain can be N bits. The variable gain buffering circuit 120 is utilized for buffering the received clock signal $CLK_2$ according to the magnitude of the received buffer gain $S_{CN}$, and accordingly outputting the clock signal $CLK_O$. In addition, the clock signals $CLK_1$, and $CLK_2$ are generated by the same clock signal source. Because of the difference of the routing in the IC layout, the phase of the clock signal $CLK_1$ is a little different from the phase of the clock signal $CLK_2$.

The buffer gain controlling circuit 110 comprises a phase detector 111 and a buffer gain controller 112. The phase detector 111 comprises input ends $I_1$ and $I_2$, and output ends $O_1$ and $O_2$. The input end $I_1$ of the phase detector 111 is utilized for receiving the clock signal $CLK_1$; the input ends $I_2$ of the phase detector 111 is utilized for receiving the clock signal $CLK_O$; the output end $O_1$ of the phase detector 111 is utilized for outputting the up signal $S_{UP}$; the output end $O_2$ of the phase detector 111 is utilized for outputting the down signal $S_{DN}$. When the phase of the clock signal $CLK_1$ leads the phase of the clock signal $CLK_O$, the phase detector 111 outputs the up signal $S_{UP}$; when the phase of the clock signal $CLK_1$ lags behind the phase of the clock signal $CLK_O$, the phase detector 111 outputs the down signal $S_{DN}$; when the phase of the clock signal $CLK_1$ is the same as the phase of the clock signal $CLK_O$, the phase detector 111 does not output either the up signal $S_{UP}$ nor the down signal $S_{DN}$.

The buffer gain controller 112 comprises input ends $I_1$ and $I_2$, and an output end O. The input end $I_1$ of the buffer gain controller 112 is utilized for receiving the up signal $S_{UP}$; the input end $I_2$ of the buffer gain controller 112 is utilized for receiving the down signal $S_{DN}$; the output end O of the buffer gain controller 112 is utilized for outputting the buffer gain $S_{CN}$. When the buffer gain controller 112 receives the up signal $S_{UP}$, the buffer gain $S_{CN}$ increases; when the buffer gain controller 112 receives the down signal $S_{DN}$, the buffer gain $S_{CN}$ decreases; when the buffer gain controller 112 does not receive the up signal $S_{UP}$ or the down signal $S_{DN}$, the buffer gain $S_{CN}$ outputted by the buffer gain controller 112 keeps unchanged.

The variable gain buffering circuit 120 adjusts the current of the clock signal $CLK_O$ according to the magnitude of the buffer gain $S_{CN}$. The larger the buffer gain $S_{CN}$ is, the larger the output current of the variable gain buffering circuit 120 is (that is, when the output current of the variable gain buffering circuit 120 has a stronger driving ability, the output clock signal $CLK_O$ is faster); the smaller the buffer gain $S_{CN}$ is, the smaller the output current of the variable gain buffering circuit 120 is (that is, when the output current of the variable gain buffering circuit 120 has a weaker driving ability, the output clock signal $CLK_O$ is slower).

Figure 2:
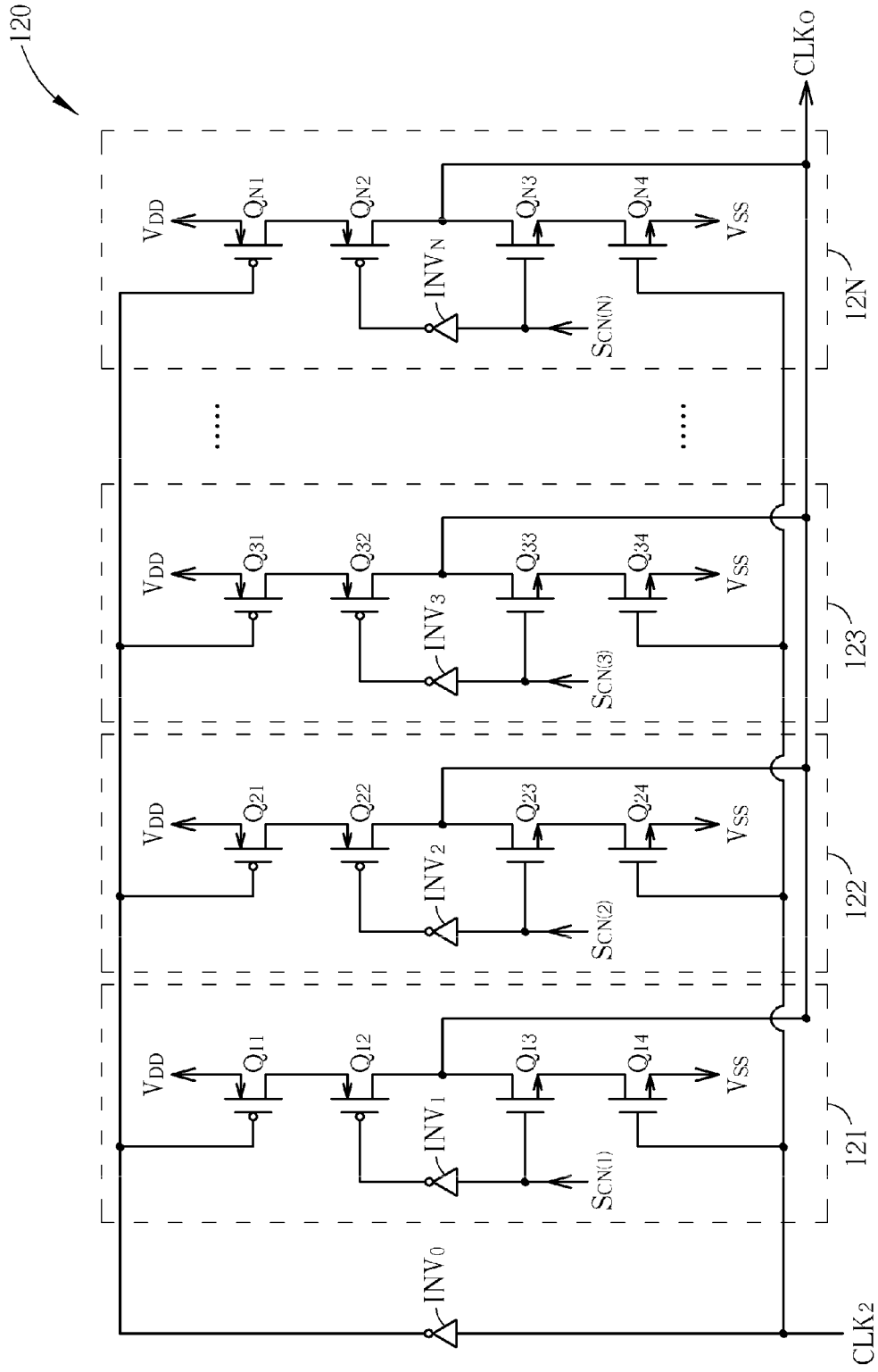
FIG. 2 is a diagram illustrated the variable gain buffering circuit of the present invention.

FIG. 2 is a diagram illustrated the variable gain buffering circuit 120 of the present invention. The variable gain buffering circuit 120 comprises an inverter $INV_0$ and N buffers 121~12N with the same circuit structure. For example, the buffer 121 comprises transistors $Q_{11}$, $Q_{12}$, $Q_{13}$, and $Q_{14}$, and an inverter $INV_1$. The inverter $INV_1$ is utilized for receiving a buffering gain bit $S_{CN(1)}$ of the buffer gain $S_{CN}$ and outputting the inverted signal of the buffering gain bit $S_{CN(1)}$. The first end (source) of the transistor $Q_{11}$ is coupled to the voltage source $V_{DD}$ (which provides the voltage $V_{DD}$); the second end (drain) of the transistor $Q_{11}$ is coupled to the first end (source) of the transistor $Q_{12}$; the control end (gate) of the transistor $Q_{11}$ is coupled to the output end of the inverter $INV_0$ for receiving the inverted signal of the clock signal $CLK_2$. The first end (source) of the transistor $Q_{12}$ is coupled to the second end of the transistor $Q_{11}$; the second end (drain) of the transistor $Q_{12}$ is coupled to the second end (drain) of the transistor $Q_{13}$; the control end (gate) of the transistor $Q_{12}$ is coupled to the output end of the inverter $INV_1$ for receiving the inverted signal of the buffer gain bit $S_{CN(1)}$. The first end (source) of the transistor $Q_{13}$ is coupled to the second end (drain) of the transistor $Q_{14}$; the second end (drain) of the transistor $Q_{13}$ is coupled to the second end of the transistor $Q_{12}$; the control end (gate) of the transistor $Q_{13}$ is coupled to the input end of the inverter $INV_1$ for receiving the buffer gain bit $S_{CN(1)}$. The first end (source) of the transistor $Q_{14}$ is coupled to the voltage source $V_{SS}$ (which provides the voltage $V_{SS}$, for example, a ground end); the second end (drain) of the transistor $Q_{14}$ is coupled to the first end of the transistor $Q_{13}$; the control end (gate) of the transistor $Q_{14}$ is coupled to the input end of the inverter $INV_0$ for receiving the clock signal $CLK_2$.

In other words, the control ends of the transistors $Q_{11}$ and $Q_{14}$ are utilized as the input end of the buffer 121 for receiving the clock signal $CLK_2$; the second ends of the transistors $Q_{12}$ and $Q_{13}$ are utilized as the output end of the buffer 121 for outputting the buffered clock signal $CLK_O$. The buffer gain bit $S_{CN(1)}$ is utilized for controlling the buffer 121 to output the buffered clock signal $CLK_O$. For example, when the buffer gain bit $S_{CN(1)}$ represents "turning-off" (the logic "0"), the buffer 121 is turned off; when the buffer gain bit $S_{CN(1)}$ represents "turning-on" (the logic "1"), the buffer 121 is turned on so as to output the buffered clock signal $CLK_O$.

In addition, the output end of each buffer 121~12N is coupled together. It is assumed that each buffer 121~12N outputs a current with the magnitude $I_P$ when it is turned on. When only one of the buffers 121~12N is turned on (only one of the buffer gain bits $S_{CN(1)}$~$S_{CN(N)}$ represents "turning-on"), the buffered clock signal $CLK_O$ has the current with the magnitude $I_P$; when only two are turned on (only two of the buffer gain bits $S_{CN(1)}$~$S_{CN(N)}$ represent "turning-on"), the buffered clock signal $CLK_O$ has the current with the magnitude ($2 \times I_P$); when N of the buffers 121~12N are turned on (all the buffer gain bits $S_{CN(1)}$~$S_{CN(N)}$ represent "turning-on"), the buffered clock signal $CLK_O$ has the current with the magnitude ($N \times I_P$). In this way, the variable gain buffering circuit 120 adjusts the magnitude of the current of the output clock signal $CLK_O$ according to the number of the buffer gain bits representing "turning-on" so as to adjust the phase of the output clock signal $CLK_O$. More particularly, in the present invention, the buffer gain controlling circuit 110 compares the phases of the clock signals $CLK_1$ and $CLK_O$, and accordingly controls the number of the bits representing "turning-on" in the buffer gain $S_{CN}$, so that the magnitude of the output current of the variable gain buffering circuit 120 is adjusted according to the buffer gain $S_{CN}$, urging the output clock signal $CLK_O$ to be synchronized with the clock signal $CLK_1$.

Figure 3:
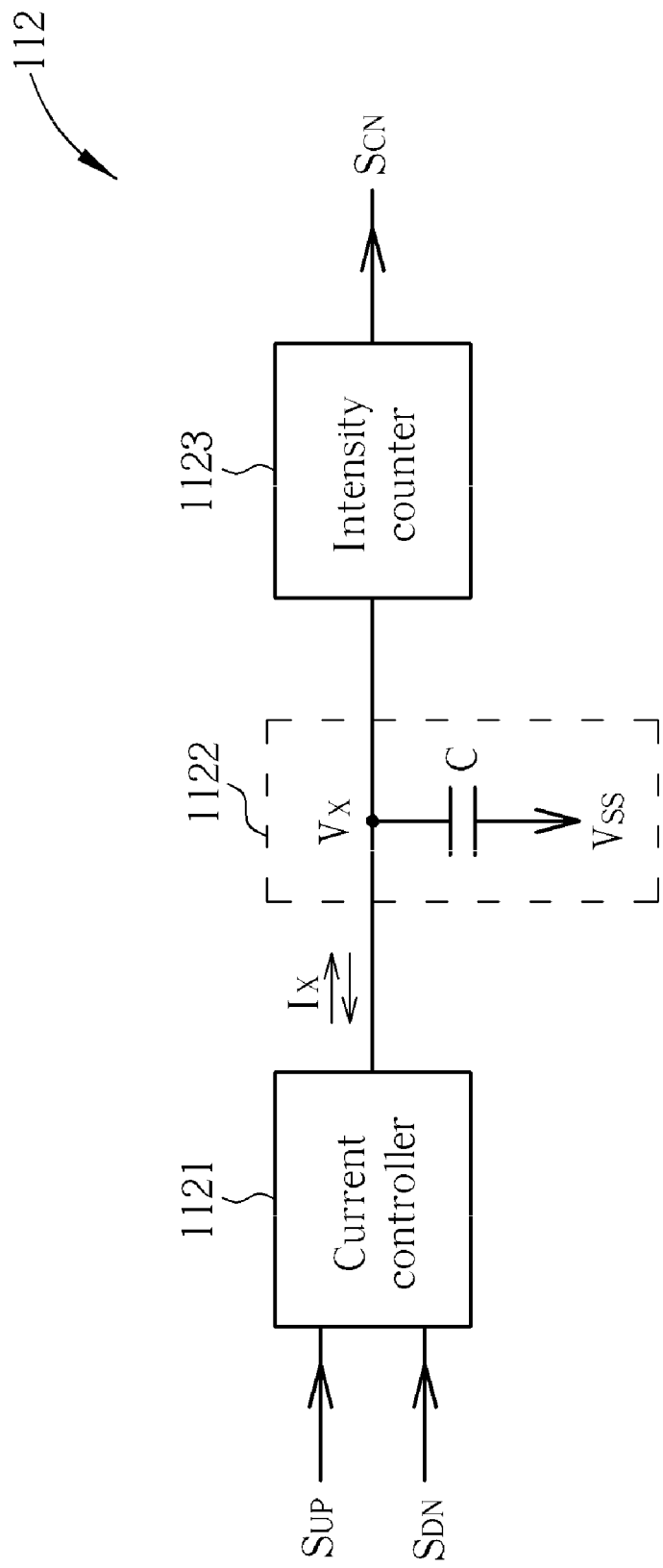
FIG. 3 is a diagram illustrating the buffer gain controller of the present invention.

As shown in FIG. 3, buffer gain controller 112 comprises current controller 1121, charge pump 1122, and an intensity counter 1123. The charge pump 1122 has a voltage capacity. For example, the charge pump 1122 comprises a capacitor C with a voltage $V_X$. The magnitude of the voltage $V_X$ can represent the voltage value of the voltage capacity of the charge pump 1122. The current controller 1121 drains/provides a current with the predetermined magnitude $I_X$ to the charge pump 1122 according to the up signal $S_{UP}$ and the down signal $S_{DN}$ for adjusting the voltage $V_X$. More particularly, when the current controller 1121 receives the up signal $S_{UP}$, the current controller 1121 provides the current $I_X$ to the charge pump 1122 so as to raise up the voltage $V_X$; when the current controller 1121 receives the down signal $S_{DN}$, the current controller 1121 drains the current $I_X$ from the charge pump 1122 so as to lower down the voltage $V_X$. The intensity counter 1123 outputs the buffer gain $S_{CN}$ according to the magnitude of the voltage $V_X$. That is, the higher the voltage $V_X$ is, the larger the number of the bits representing "turning-on" in the buffer gain $S_{CN}$ is; the lower the voltage $V_X$ is, the smaller the number of the bits representing "turning-on" in the buffer gain $S_{CN}$ is.

Figure 4:
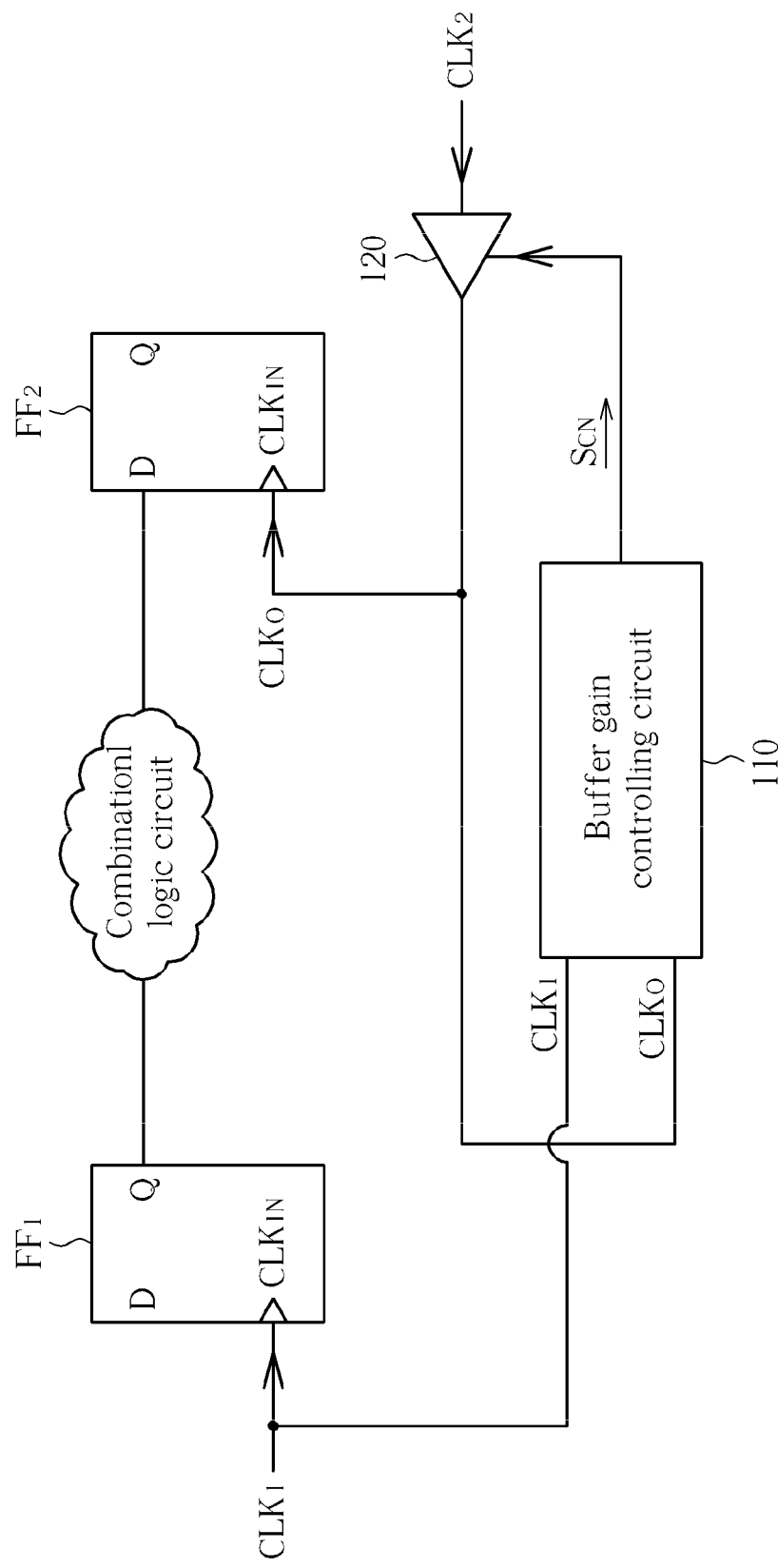
FIG. 4 is a diagram illustrating the clock signal balancing circuit of the present invention applied in the IC layout.

Please refer to FIG. 4. The present invent can be applied between any two adjacent memory elements (register) belonging to the same data-flow. The registers can be realized in various ways, for example, flip-flops, latches, and so on. In the present invention, the registers are realized by flip-flops for example. However, the registers realized in other ways still can be applied in the present invention. In FIG. 4, the flip-flops $FF_1$, and $FF_2$ belongs to the same data-flow and are adjacent to each other. That is, there is no flip-flop between the flip-flops $FF_1$ and $FF_2$ except the combinational logic circuit. The clock signal balancing circuit 100 of the present invention is utilized for balancing the clock signals received by the flip-flops $FF_1$ and $FF_2$ so as to synchronize the received clock signals of the flip-flops $F_1$ and $FF_2$. As shown in FIG. 4, the clock signal $CLK_1$ is transmitted to the flip-flop $FF_1$ and the buffer gain controlling circuit 110 as well; the clock signal $CLK_O$ is transmitted to the flip-flop $FF_2$ the buffer gain controlling circuit 110 as well. In this way, the buffer gain controlling circuit 110 controls the buffer gain $S_{CN}$ of the variable gain buffering circuit 120 according to the phase difference between the clock signals $CLK_1$ and $CLK_O$, so that the clock signal $CLK_O$ with the same phase as the clock signal $CLK_1$ according to the magnitude of the buffer gain $S_{CN}$ and the clock signal $CLK_2$.

Figure 5:
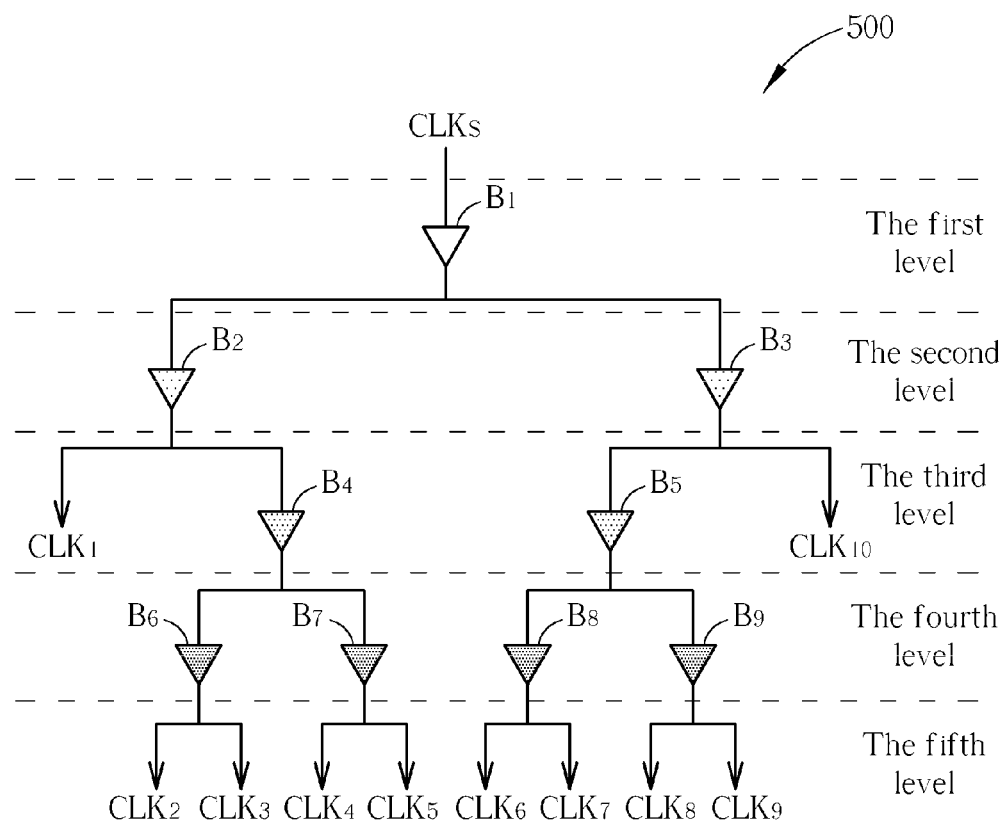
FIG. 5 is a diagram illustrating a clock signal tree.

As shown in FIG. 5, in the clock signal tree 500, a clock signal source $CLK_S$ is fanned out through multi-level buffer structure. The clock signal source $CLK_S$ can be provided by the Phase Lock Loop (PLL) in the chip. The number of the branches fanned out by a buffer is set to be 2. Moreover, the clock signal tree 500 can be divided into five levels. The buffer $B_1$ is at the first level; the buffers $B_2$ and $B_3$ are at the second level; the buffers $B_4$ and $B_5$, and the clocks signals $CLK_1$ and $CLK_{10}$ are at the third level; the buffers $B_6$~$B_9$ are at the fourth level; the clock signals $CLK_2$~$CLK_{10}$ are at the fifth level. The clock signal source $CLK_S$ is buffered by the first level buffer $B_1$ and fanned out to the second level buffers $B_2$ and $B_3$. The second-level buffers $B_2$ and $B_3$ respectively buffer and outputted the received clock signals to the third level buffers $B_4$ and $B_5$, and generate the third level clock signals $CLK_1$ and $CLK_{10}$. The third-level buffers $B_4$ and $B_5$ fan out and provide the buffered clock signals to the fourth level buffers $B_6$ and $B_9$ respectively. The fourth-level buffers $B_6$~$B_9$ generate the fifth clock signals $CLK_2$~$CLK_9$ accordingly.

Figure 6:
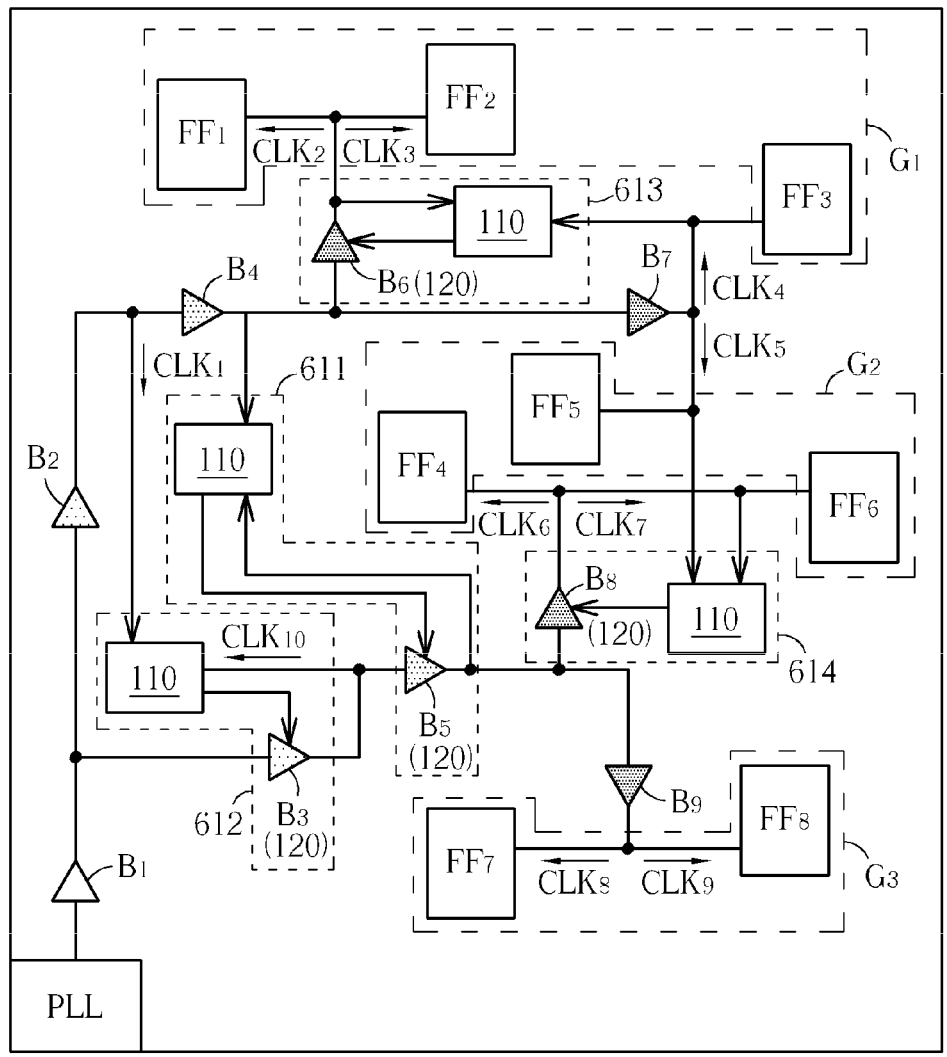
FIG. 6 is a diagram illustrating the clock signals of the same data-flow are balanced in the IC layout according to the present invention.

As shown in FIG. 6, it is assumed that the flip-flops $FF_1$~$FF_3$ belong to the same data-flow $G_1$; the flip-flops $FF_4$~$FF_6$ belong to the same data-flow $G_2$; the flip-flops $FF_7$~$FF_8$ belong to the same data-flow $G_3$. The placements of the flip-flops $FF_1$~$FF_8$ is fixed. The present invention can selectively balance (synchronize) the clock signals received by two adjacent flip-flops of the same data-flow. The clock signal balancing circuits 611~614 are disposed as shown in FIG. 6, wherein the functions of the clock signal balancing circuit 611~614 are the same as the above-mentioned clock signal balancing circuit 100. That is, the buffers $B_3$, $B_5$, $B_6$, and $B_8$ all have to be realized by the variable gain buffering circuit 120 of the present invention, and the other buffers $B_1$, $B_2$, $B_4$, $B_7$, and $B_9$ can be realized by general buffers. In this way, since the clock signal balancing circuits 611~614 are disposed between the adjacent flip-flops belonging to the same data-flow, the setup time error and the hold time error can be avoided. In addition, by means of the clock signal balancing circuit of the present invention, the CAD's staff does not have to consider too much about the routing of the clock signals, for example, the number of the buffers which the clock signal passes by, the routing length of the clock signal, and so on. As a result, the CAD's staff can design the routing of the clock signals more conveniently.

In the data-flow $G_1$, because the flip-flops $FF_1$ and $FF_2$ receive the clock signals $CLK_2$ and $CLK_3$ from the buffer $B_6$, it could save the clock signal balancing circuit between the flip-flops $FF_1$ and $FF_2$. However, since the clock signals received by the flip-flops $FF_2$ and $FF_3$ are generated by the different buffer (the clock signal $CLK_2$ from the buffer $B_6$, and the clock signal $CLK_4$ from the buffer $B_7$), the clock signals between the flip-flops $FF_2$ and $FF_3$ have to be balanced. That is, the clock signal $CLK_4$ from the buffer $B_7$ is inputted into the buffer gain controlling circuit 110 of the clock signal balancing circuit 613 and the buffer $B_6$ is realized by the variable gain buffering circuit 120. In this way, the clock signal $CLK_3$ received by the flip-flop $FF_2$ and the clock signal $CLK_4$ received by the flip-flop $FF_3$ are balanced. In the data-flow $G_2$, the flip-flops $FF_4$ and $FF_6$ receive the clock signals $CLK_6$ and $CLK_7$ from the same buffer $B_8$, and the flip-flop $FF_5$ receives the clock signal $CLK_5$ generated by the buffer $B_7$. Therefore, the clock signals between the flip-flops $FF_5$ and $FF_6$ have to be balanced. That is, the clock signal $CLK_7$ generated by the buffer $B_8$ is inputted into the buffer gain controlling circuit 110 of the clock signal balancing circuit 614 and the buffer $B_8$ is realized by the variable gain buffering circuit 120. In this way, the clock signal $CLK_5$ received by the flip-flop $FF_5$ and the clock signal $CLK_7$ received by the flip-flop $FF_6$ are balanced. In addition, since the clock signals $CLK_6$ and $CLK_7$ from the buffer $B_8$ are balanced with the clock signal $CLK_5$ from the buffer $B_7$, the clock signals $CLK_6$ and $CLK_5$ respectively received by the flip-flops $FF_4$ and $FF_5$ are actually balanced as well (which means the clock signal $CLK_6$ is synchronized with the clock signal $CLK_5$). In the data-flow $G_3$, the flip-flops $FF_7$ and $FF_8$ receive the clock signals $CLK_8$ and $CLK_9$ from the buffer $B_9$, the clock signal balancing circuit is not required to be disposed between the flip-flops $FF_7$ and $FF_8$. That is, the buffer $B_9$ can be realized by a general buffer.

In addition, for avoiding the phase difference between the clock signals of the rear level is so large that the clock signal balancing circuit can not totally eliminating the phase difference, the present invention prefers to balance the clock signals at the front level. As shown in FIG. 6, the clock signal balancing circuits 611 and 612 are utilized for balancing the clock signals of the front level of the clock signal tree. Consequently, the buffer $B_5$ is set to be the variable gain buffering circuit 120 and the buffer gain controlling circuit 110 is disposed in the clock signal balancing circuit 611. The buffer $B_3$ is set to be the variable gain buffering circuit 120 and the buffer gain controlling circuit 110 is disposed in the clock signal balancing circuit 612. However, if the phase difference between the clock signals of the rear level is not too large, the clock signal balancing circuits 611 and 612 can be removed and the buffers $B_3$ and $B_6$ can be realized by general buffers.

Figure 7:
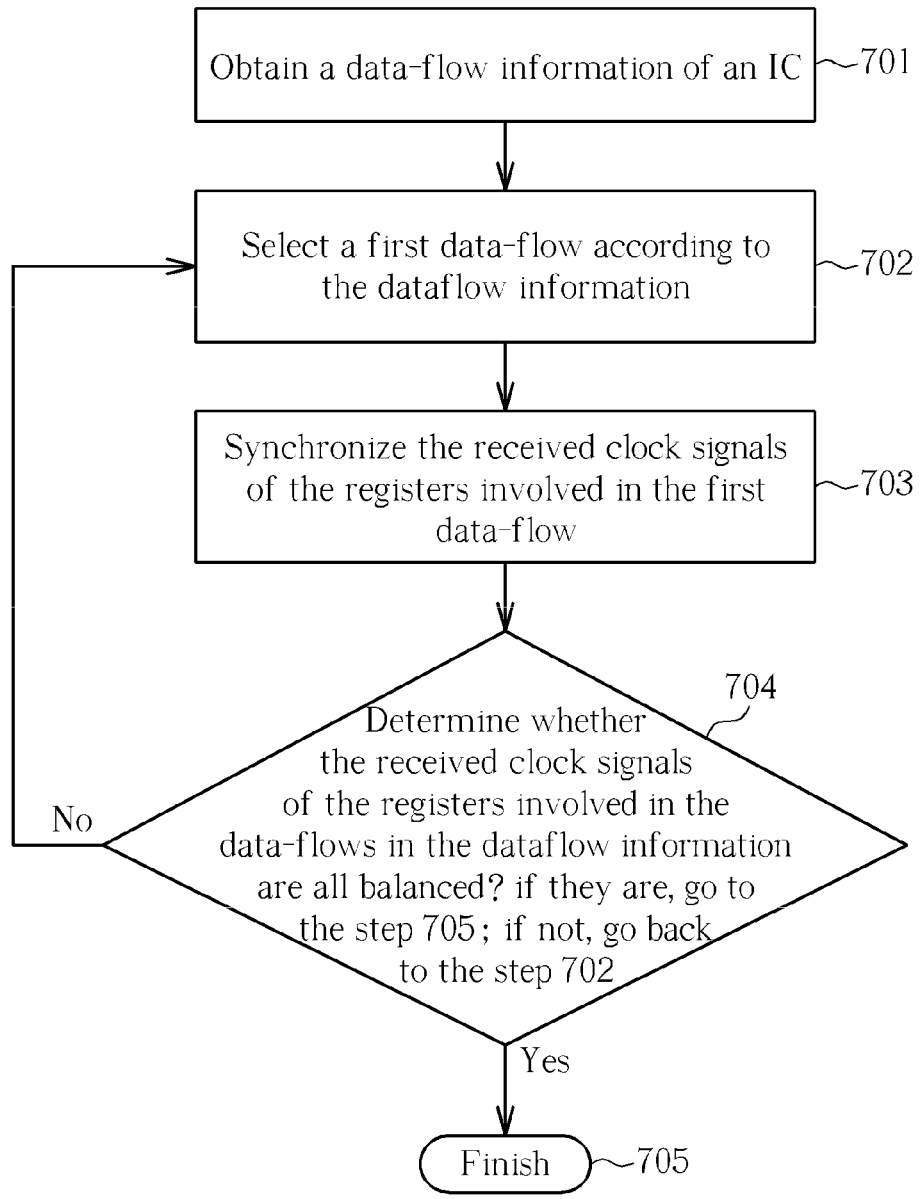
FIG. 7 is a flow diagram illustrating a method for balancing the clock signals in the IC layout process according to the present invention.

Please refer to FIG. 7, which is a flow diagram illustrating a method 700 for balancing the clock signals in the IC layout according to the present invention. The steps are illustrated as below:

step 701: obtain a data-flow information of the IC;
step 702: select a first data-flow according to the dataflow information;
step 703: synchronize the received clock signals of the registers involved in the first data-flow;
step 704: determine whether the received clock signals of the registers involved in the data-flows in the dataflow information are all balanced; if they are, go to the step 705; if not, go back to the step 702;
step 705: finish.

In the step 702, the computer assisted designer can divide the data-flows into multiple groups of data-flows, wherein the multiple groups are not correlated each other, according to the obtained data-flow information. That is, the first data-flow selected in the step 720 only flows to the registers involved in the first data-flow. Hence, the registers involved in the first data-flow can be separated from the registers involved in the other data-flows when the designer considers about balancing the clock signals.

In the step 703, the method 700 of the present invention disposes the clock signal balancing circuit 100 corresponding to the adjacent registers of the same data flow for solving the problem of the setup time error and hold time error in the adjacent registers, caused by the unsynchronized clock signals. In the present invention, the adjacent registers means that the data-flow between the two registers does not pass by another register. There is only a combinational logic circuit disposed between the adjacent registers, or the data processed by the previous-level register is directly transmitted to the next-level register. However, if the adjacent registers receive the clock signals generated by the same buffer, then the received clock signals do not have to be balanced, as mentioned in the related description of FIG. 6.

In addition, in the step 703, the method 700 of the present invention only balances the received clock signals of the registers belonging to the same data-flow. That is, if two registers do not belong to the same data-flow (the data processed by the two registers are not affected by each other), the method 700 of the present invention does not balance the received clock signals of the two registers.

In conclusion, the clock signal balancing circuit and the method of the present invention can effectively avoid the setup time error and the hold time error generated by the registers, and can keep the routing of the clock signals not too complicated. The number of the buffers for delaying the clock signals can be effectively reduced. In this way, the complexity of the routing of the clock signals is reduced, providing a great convenience.

Those skilled in the art will readily observe that numerous modifications and alterations of the device and method may be made while retaining the teachings of the invention.

What is claimed is:

1. A clock signal balancing circuit for synchronizing a first clock signal with a second clock signal, the clock signal balancing circuit comprising:
   a buffer gain controlling circuit for comparing the first clock signal with the second clock signal and accordingly generating a buffer gain; and
   a variable gain buffering circuit coupled to the buffer gain controlling circuit, wherein the variable gain buffering circuit receives a third clock signal, adjusts a timing of the third clock signal accord to an amplitude of the buffer gain, and outputs the adjusted third clock signal;
   wherein the first clock signal is received by a first register, and the second clock signal is received by a second register; wherein data processed by the first register is related to data processed by the second register; wherein the data processed by the first register is directly transmitted to the second register or transmitted through a combinational logic circuit to the second register.

2. The clock signal balancing circuit of claim 1, wherein the buffer gain controlling circuit comprises a phase detector and a buffer gain controller; wherein the phase detector is utilized for comparing a phase of the first clock signal with a phase of the second clock signal and accordingly outputting an up signal or a down signal; wherein the buffer gain controller is coupled to the phase detector for generating the buffer gain according to the up signal or the down signal.

3. The clock signal balancing circuit of claim 2, wherein when the phase of the first clock signal leads the phase of the second clock signal, the phase detector outputs the up signal; wherein when the phase of the first clock signal lags behind the phase of the second clock signal, the phase detector outputs the down signal.

4. The clock signal balancing circuit of claim 2, wherein when the buffer gain controller receives the up signal, the buffer gain increases; when the buffer gain controller receives the down signal, the buffer gain decreases.

5. The clock signal balancing circuit of claim 2, wherein the variable gain buffering circuit comprises a plurality of buffers; wherein an input end of each of the plurality of the buffers is utilized for receiving the third clock signal; output ends of the plurality of the buffers are coupled to each other for outputting the adjusted third clock signal; the first clock signal and the third clock signal are generated by a same clock signal source.

6. The clock signal balancing circuit of claim 5, wherein a number of the plurality of the buffers is N, and the buffer gain has N bits; wherein when the buffer gain increases, a number of bits representing turning-on in the N bits increases; wherein when the buffer gain decreases, the number of bits representing turning-on in the N bits decreases.

7. The clock signal balancing circuit of claim 6, wherein the buffer gain controller comprises:
   a current controller for providing or draining a predetermined current according to the up signal or the down signal;
   a charge pump having a voltage capacity coupled to the current controller; wherein the voltage capacity has a voltage value; and
   an intensity counter for outputting the buffer gain according the voltage value in the voltage capacity, wherein the number of the bits representing turning-on in the N bits of the buffer gain is related to the voltage value in the voltage capacity;
   wherein when the current controller receives the up signal, the current controller charges the charge pump by the predetermined current for raising up the voltage value in the voltage capacity;
   wherein when the current controller receives the down signal, the current controller discharges the charge pump by the predetermined current for lowering down the voltage value in the voltage capacity.

8. The clock signal balancing circuit of claim 6, wherein the variable gain buffering circuit further comprises a first inverter for receiving the third clock signal and accordingly generating an inverted signal of the third clock signal.

9. The clock signal balancing circuit of claim 8, wherein each buffer of the N buffers comprises:
   a second inverter for receiving a corresponding bit of the buffer gain, and accordingly outputting an inverted signal of the corresponding bit;
   a first transistor having a first end coupled to a first voltage source, a second end, and a control end coupled to an output end of the first inverter for receiving the inverted signal of the third clock signal;
   a second transistor having a first end coupled to the second end of the first transistor, a second end utilized as an output end of the buffer, and a control end coupled to an output end of the second inverter for receiving the inverted signal of the corresponding bit;
   a third transistor having a first end, a second end coupled to the second end of the second transistor, and a control end coupled to the output end of the second inverter for receiving the corresponding bit of the buffer gain; and
   a fourth transistor having a first end coupled to a second voltage source, a second end coupled to the first end of the third transistor, and a control end coupled to the input end of the first inverter for receiving the third clock signal;
   wherein when the corresponding bit of the buffer gain represents turning-on, the buffer is turned on for outputting the third clock signal;
   wherein when the corresponding bit of the buffer gain represents turning-off, the buffer is turned off for not outputting the third clock signal;
   wherein the second voltage source is a ground end.

10. A method for balancing clock signals in an IC (Integrated Circuit) layout, comprising:
    obtaining a data-flow information of an IC;
    selecting a first data-flow according to the dataflow information; and
    synchronizing a first clock signal from a first register and a second clock signal from a second register involved in the first data-flow;
    wherein data processed by the first register is directly transmitted to the second register or transmitted through a combinational logic circuit to the second register;
    wherein the first data-flow is not related to other data-flows in the data-flow information.

11. The method of claim 10, wherein the step of synchronizing comprises:
    receiving a third clock signal and buffering the third clock signal by a first variable gain buffering circuit for generating the second clock signal; and
    comparing the first clock signal with the second clock signal by a first phase detector for adjusting a buffer gain of the first variable gain buffering circuit;
    wherein the first clock signal and the third clock signal are generated by a same clock signal source.

12. The method of claim 11, wherein the step of comparing comprises:

when a phase of the first clock signal leads a phase of the second clock signal, raising up the buffer gain to raise up an output current of the first variable gain buffering circuit; and when the phase of the first clock signal lags behind the phase of the second clock signal, lowering down the buffer gain to reduce the output current of the first variable gain buffering circuit.

13. The method of claim 12, further comprising:

synchronizing the second clock signal from the second register and a fourth clock signal from a third register involved in the first data-flow;

wherein the data processed by the second register is directly transmitted to the third register or transmitted through a combinational logic circuit to the third register.

14. The method of claim 13, wherein the step of synchronizing the second clock signal and fourth clock signal comprises:

receiving a fifth clock signal, and buffering the fifth clock signal by a second variable gain buffering circuit for generating the fourth clock signal; and comparing the second clock signal with the fourth clock signal by a second phase detector for adjusting a buffer gain of the second variable gain buffering circuit;

wherein the first clock signal, the third clock signal, and the fifth clock signal are generated by the same clock signal source.

15. The method of claim 14, wherein the step of comparing the second clock signal with the fourth clock signal comprises:

when the phase of the second clock signal leads a phase of the fourth clock signal, raising up a buffer gain of the second variable gain buffering circuit to raise up an output current of the second variable gain buffering circuit; and when the phase of the second clock signal lags behind the phase of the fourth clock signal, lowering down the buffer gain of the second variable gain buffering circuit to reduce the output current of the second variable gain buffering circuit.

16. The method of claim 10, wherein the first clock signal and the second clock signal are not generated by a same buffer.

* * * * *